United States Patent [19]

Martin

[11] Patent Number: 5,766,496
[45] Date of Patent: Jun. 16, 1998

[54] DECAPSULATOR AND METHOD FOR DECAPSULATING PLASTIC ENCAPSULATED DEVICE

[75] Inventor: Kirk Alan Martin, Aptos, Calif.

[73] Assignee: Nisene Technology Group, Inc., Santa Cruz, Calif.

[21] Appl. No.: 656,498

[22] Filed: May 31, 1996

[51] Int. Cl.$^6$ .................................................. B44C 1/22
[52] U.S. Cl. ........................ 216/56; 156/345; 216/90; 216/92
[58] Field of Search ................... 156/345 L, 345 LS, 156/637.1, 639.1; 216/38, 56, 90, 92; 438/745, 747, 748, 749

[56] References Cited

U.S. PATENT DOCUMENTS

| | | | |
|---|---|---|---|
| 4,344,809 | 8/1982 | Wensink | 156/345 |
| 4,359,360 | 11/1982 | Harris et al. | 156/345 |
| 4,826,556 | 5/1989 | Kobayashi | 156/345 |
| 5,127,991 | 7/1992 | Lal et al. | 156/659.1 |
| 5,252,179 | 10/1993 | Ellerson et al. | 156/655 |
| 5,271,798 | 12/1993 | Sandhu et al. | 156/638 |

OTHER PUBLICATIONS

Brochure entitled: "B&G Decapsulator", Model 250,B & G International, Soquel, California (6 pages), pre–May 1995.

*Primary Examiner*—Williaim Powell
*Attorney, Agent, or Firm*—Skjerven Morrill MacPherson Franklin & Friel; Thomas S. MacDonald

[57] ABSTRACT

An apparatus and method for selectively etching an encapsulant forming a package of resinous material around an electronic device includes a etchant solution source and an etching assembly including an etch plate and a movable cover forming an etching chamber. An etch head is supported by the plate and the device package is mountable in the chamber on the etch head. A first syringe pump pumps a first quantity of etchant into the etch head and a second syringe pump agitates or oscillates at least part of the first quantity of etchant repeatedly into and out of an etched cavity formed on the package exterior surface by reaction of the etchant solution with the resinous material. A waste outlet and reservoir extends from the etch head. The etch head is attached to an alumina ceramic heat exchanger including a spirally grooved passageway formed by an inserted core to heat a small volume of etchant immediately prior to introduction of the etchant against the package and subsequent oscillation.

24 Claims, 4 Drawing Sheets

1
DECAPSULATOR AND METHOD FOR DECAPSULATING PLASTIC ENCAPSULATED DEVICE

FIELD OF THE INVENTION

The present invention relates to an apparatus and method for applying an etchant to a plastic encapsulated device, particularly to an epoxy encased semiconductor chip, to provide access to the device or chip for internal visual inspection, test and repair.

BACKGROUND OF THE INVENTION

Plastic packaging of various electronic devices including semiconductor chips have been employed for some years. Typical an epoxy resin is molded around the chip, a central portion of a lead frame and bonding wires or other connections between contact pads on the chip to inner lead fingers on the lead frame. It is often desirous to decapsulate the package at least in part to allow for inspection, test and repair of the chip and the wire bonds to the chip and inner lead fingers, after the epoxy covering these elements is safely and effectively removed.

Commonly, concentrated acids such as sulfuric and nitric acids or other solvents for the resin have been employed. Problems in prior art decapsulators and methods include difficulty in controlling the desired amount of etching, in removing debris formed in the etching process, prevention of damage to the package including interior metallization and providing for adequate safety.

An early patent in the decapsulator art is Wensink U.S. Pat. No. 4,344,809 where a jet etch apparatus includes an etching block and a jet pump provides for etchant flow.

A Decapsulator sold by B&G Enterprises, Inc. of Soquel, Calif., namely a Model 250, includes an appropriate acid resistant gasket seated on an etch head and the device to be decapsulated is placed on the gasket. A safety cover closes automatically when the process is started, clamping the device in place. The gasket on the etch head allows the chamber to be sealed and pressurized with nitrogen to approximately two PSI. The etching is started when a metering pump moves etchant from a heat exchanger located in plate with a sinuous passage into a cavity formed by the gasket, the device and the etch head. The acid remains in the chamber for a short period of time, where it reacts with or attacks the encapsulant material. After the etchant has been allowed to work, the pump is activated again and a fresh volume of acid is moved into the cavity. This process continues until the desired amount of device exposure is achieved. When the integrated circuit is exposed at the end of the etch cycle, the pump runs continuously to flush the cavity. After this rinsing period the entire system is purged with nitrogen, blowing all waste materials into the waste bottle. At the end of the process, the safety cover opens automatically and the device is removed for post-etch cleaning.

U.S. Pat. No. 5,252,179 discloses a method and apparatus for selective spray etching of an epoxy encapsulated chip. A diaphragm can be raised or lowered to direct flow of etchant, and debris is removed without moving the chip from the chip carrier. Used etchant is collected and recycled. U.S. Pat. No. 5,127,991 shows a process for an etching copper sheets in which a pumped source of etchant is heated. U.S. Pat. No. 5,271,798 shows an etching process for tungsten residue on a semiconductor wafer including a sealed apparatus with an etchant inlet port and suction removal of etching byproduct.

2

In at least some of the prior art devices various deficiencies have been encountered. For example, a fixed etch head is provided which limits the area of the package which is to be etchant attacked; external auxiliary heaters must be used to heat the etchant; excessive etchant fume or seepage limit seal life; there is inefficient removal of etching debris; a particular slowness of the etching process is present due to non-reactive materials at the etch face; and there is a lack of keeping acid consumption low.

SUMMARY OF THE INVENTION

The present invention relates to an apparatus and method for decapsulation of a packaged electronic device where an oscillatory, agitating flow of etchant is provided in an etching cavity for removal of non-reactive elements of the epoxy resin from the etch face resulting in the exposure of more of the reactive material for faster etching. The effect reduces the etch time, the total cycle time due to reduced line fill time and a shorter etchant heat time, while keeping acid consumption low. In one embodiment an interchangeable etch head is provided which allows easy substitutions of etching area styles, that is the size and shape of the package area on which the etchant will attack and etch away the resin. The reduced etchant heat time is accomplished by providing an alumina ceramic heat exchanger block, with an acid inlet port, a waste outlet port and an alumina ceramic, grooved cylinder heat exchanger or multiple holed alumina block in flow connection to the inlet port, and a surrounding aluminum heater block containing at least one resistance heater. Thus only a relative small volume of etchant need be heated immediately prior to the flow of the etchant against the package, lessening the overall decapsulating time.

The apparatus for selectively etching an encapsulant forming a package around an electronic device includes a source of etchant solution; an etching assembly including an etch plate and a movable cover, the etch plate and cover forming an etching chamber; and an etch head supported by the etch plate. An electronic device package to be decapsulated is mounted in the chamber on the etch head. A first pump is provided for pumping a first quantity of etchant solution into the etch head and a second pump provided for agitating the first quantity of etchant solution into and out of an etched cavity formed on an exterior surface of the electronic device package. Debris from the etching of the package is forced through a waste outlet extending from the etch head to a waste reservoir. In a preferred embodiment, the first pump and the second pump are syringe pumps.

In another embodiment an apparatus for selectively etching an encapsulant forming a package around an electronic device includes a source of etchant solution; an etching assembly including an etch plate and a movable cover, the etch plate and cover forming an etching chamber; and an etch head supported by the etch plate. An electronic device package to be decapsulated is mounted in the chamber on said etch head. The etch head includes a demountable cylindrical plug, O-ring sealed in the etch plate, the plug having a passageway extending through the plug in flow connection to the source of etchant solution. The electronic device package is mounted on a surface of the plug facing the etching chamber.

DETAILED DESCRIPTION

Figure 1:
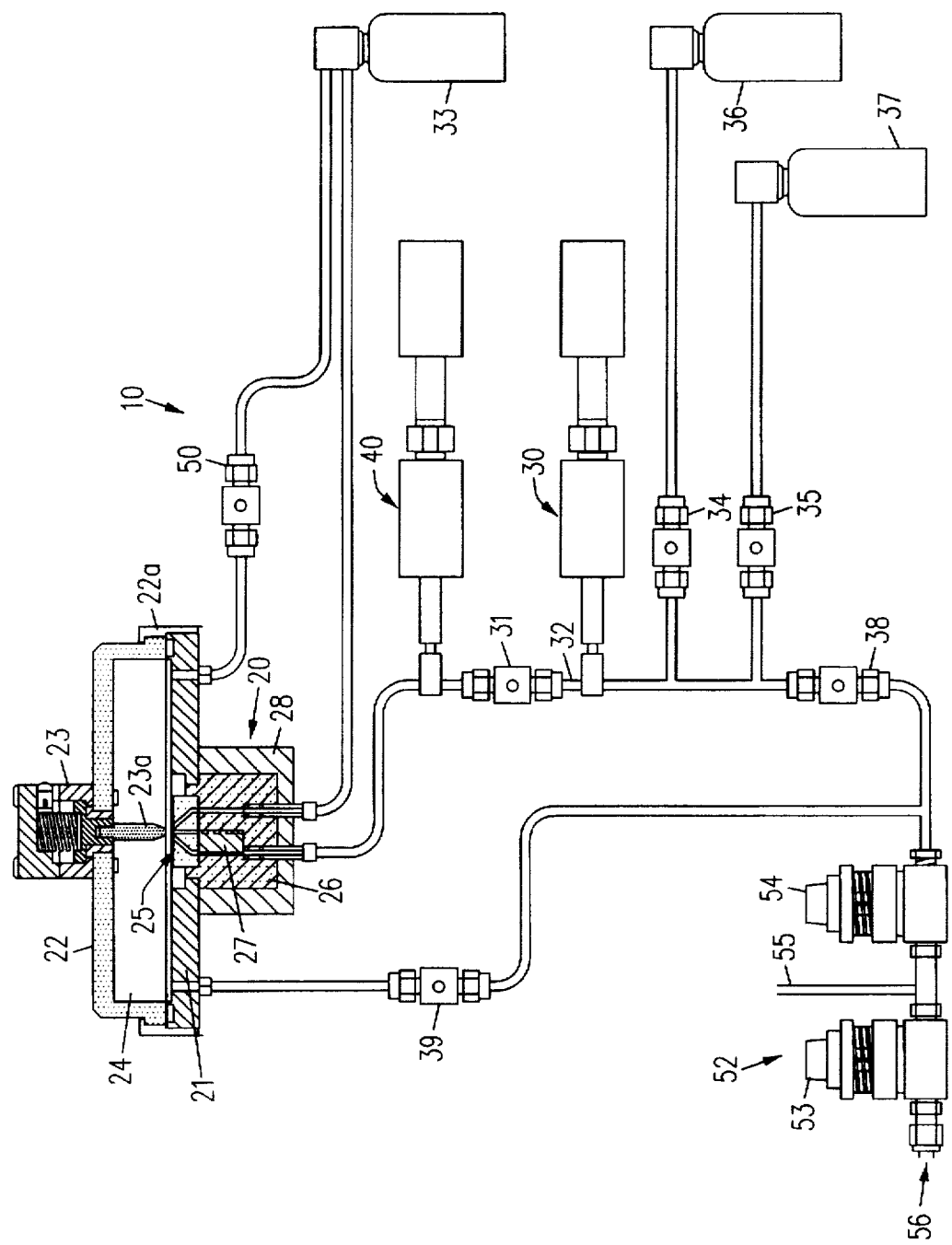
FIG. 1 is a schematic side view partially in section of the overall encapsulation apparatus.

FIG. 1 shows a decapsulating system 10 including an etch head assembly 20 including an etch plate 21, and movable cover 22 clamped on by clamps 22a or otherwise pivoted by structure (not shown) to the etch plate. A spring pressed holder 23 with a ram nose 23a holds the electronic device package 3 (FIG. 3) to be decapsulated against an etch head top surface 25a and gasket or seal 5. The etch head 25 includes an etchant solution inlet passage 11 and waste outlet passages 12 (FIG. 3) leading to a waste bore 15 in a heat exchanger block 26. Block 26 abuts the bottom of the etch head 25 and includes a heat exchanger core 27 having a spirally grooved exterior forming with the walls of a bore 14 in block 26 a spiral passageway 17 for heating etchant solution flowing through the passageway. A heater block 28 including one or more resistance heaters 29 (FIG. 6), concentrically surrounds the cylindrical periphery of heat exchanger block 26. The passageway 17 extends spirally in parallel to the longitudinal axis 8 of block 26 and etch head 25.

Figure 3:
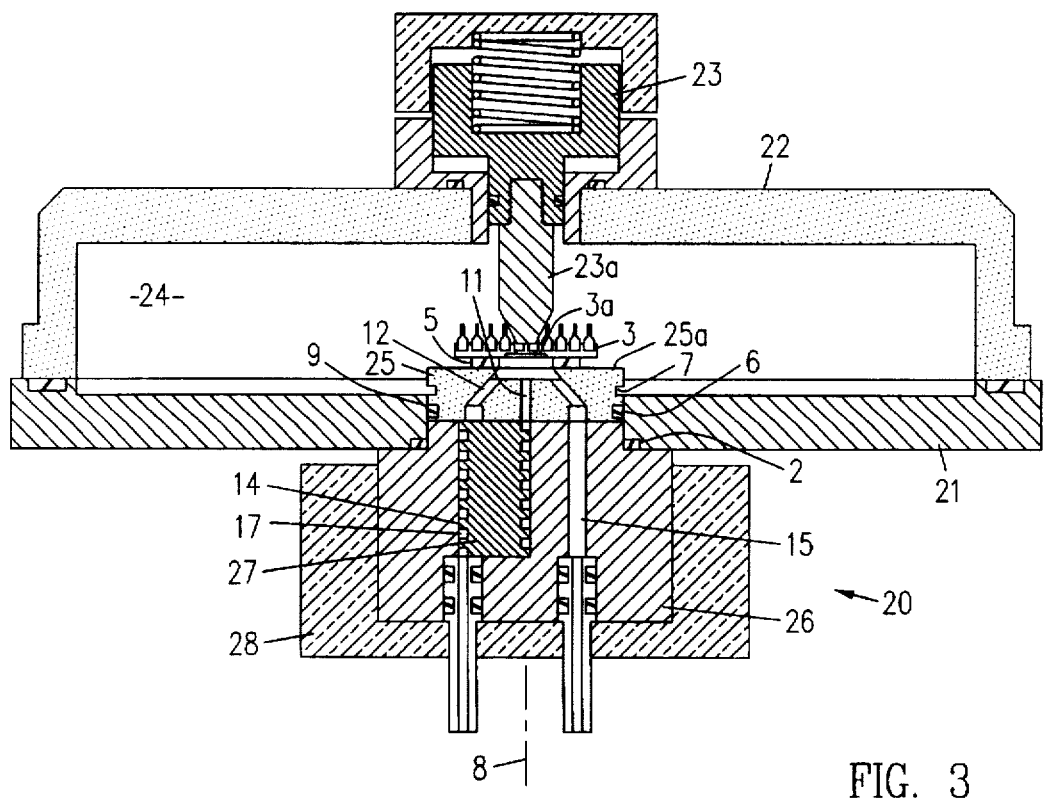
FIG. 3 is a cross-sectional view of the etch head assembly with an integrated circuit chip mounted on the etch head for decapsulation.
Figure 4:
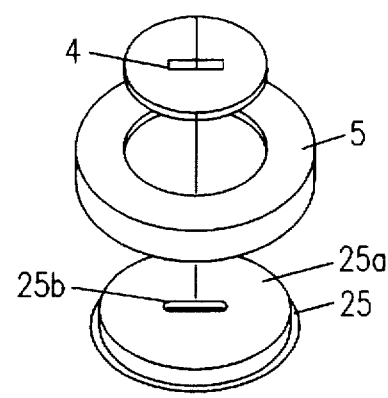
FIG. 4 is an exploded perspective view of the etch head mount for the encapsulated device.

In one embodiment as shown in FIG. 3 the etch head 25 is in press-fitted engagement within a bore 9 in etch plate 21. The etch head contains a cylindrical peripheral groove and O-ring 6 which seals the etch head in the etch plate. A second O-ring 2 seals heat exchanger block 26 in bore 9. A second cylindrical groove 7 extending in a plane above the plane of the etch plate, functions as a finger-grasping groove for manually and easily removing the etch head from bore 9 for replacement, when desired, with an etch head having a different size or shape of exit orifice. For example a cross-shaped orifice can be used to better reach the corners of a rectangular package interior with the agitating stream of acid. FIG. 4 illustrates the top 25a of the etch head 25 with a straight etch orifice 25b therein. A gasket alignment ring 5 and a cavity definition etch disk or gasket 4, as used in the Model 250 Decapsulator is employed for mounting the device 3.

Figure 2:
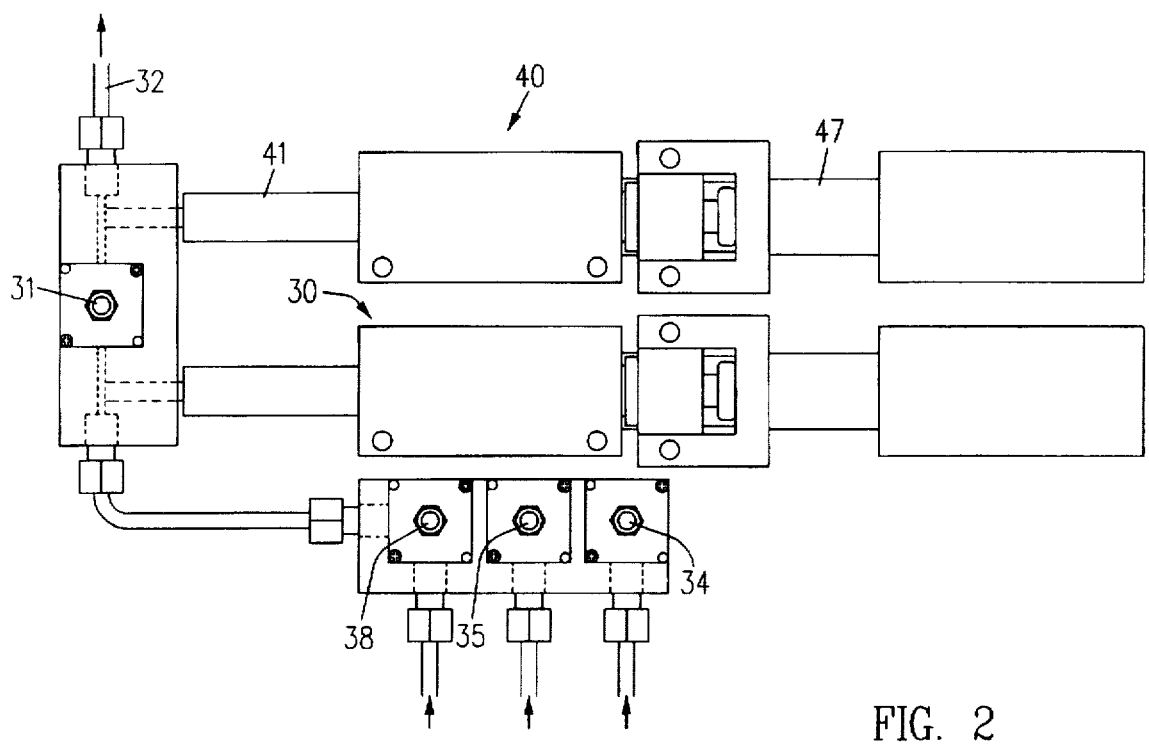
FIG. 2 is a top view of the two-pump subsystem and etchant solution valving.

Referring back to FIGS. 1 and 2, a first acid-resistant syringe pump 30 operates as a positive displacement pump utilizing a standard syringe as the displacement cylinder and piston. The syringe is connected to a first flow valve 31 in a flow line 32 which extends to the heat exchanger block 26.

To eliminate any problems resulting from non-pulsing flow, a second acid-resistant syringe pump 40 is positioned upstream of valve 31 and in connection to flow line 32 to introduce an oscillating flow of etchant solution. This pump 40 will, during the etching portion of the process, keep moving acid into and out of an etched cavity 3a being continually formed on the package exterior which is exposed to the etchant or digester of the package encapsulant and which action eventually provides the desired cavity in the package. This will create an effective flow rate (milliliter\minute), for example, sixty times the volume of the agitator syringe when the syringe is cycled once per second. The effective flow rate is high enough to remove all etch debris and gas from the cavity formed by the etching. Once the volume in flow line 32 fills the passageways in the heat exchanger block, the additional increments of acid introduced by pump 30 carry the resultant debris from the etching zone (cavity) to a waste reservoir 33, such as a waste bottle.

The agitator syringe 40, with valve 31 shut closed, will create effective flow rates and agitation against the package being decapsulated, while keeping acid consumption low. The agitator syringe preferably will swish back and forth a smaller volume, for example ½ milliliter, than the main pump syringe 30 increment(s) which, for example, will inject 2.5 ml. of etchant solution. Both of these syringes normally have a limited plunger life but are easy and inexpensive to service. Any seepage around the plunger is controllable to a workable level. The fixed volume of the main syringe 30 injection will be no problem since the addition of acid increments and the action of the agitator syringe 40 produces the necessary flow to remove debris. On packages that etch very slowly, the flow rate can be reduced accordingly. In typical use there should be no situation where more than 10 ml. of acid is required.

The maintenance cycle for the system will be limited by the operational life of the syringe plungers and the pneumatic air cylinder O-rings. All of the wear related parts are made to allow easy replacement during the periodic maintenance procedure. The overall system life will be determined by the control valve diaphragms and spring life.

Second and third valves 34 and 35 are in flow connection with flow line 32 and to respective sources 36 and 37 of etchant solution, such as sulfuric acid or nitric acid, in particular fuming nitric acid, respectively.

A fourth valve 38 in flow line 32 is connected to a nitrogen gas or other inert gas supply 56 as shown in a prior art gas sub-system 52 to supply inert gas for conveying debris to waste as needed and for supplying initial pressurization inert gas through a fifth valve 39 to a chamber 24 between the etch plate 21 and cover 22. A sixth valve 50 is openable to purge the chamber of initial oxidizing gas or air and of any etching debris occasioned by leakage past the held device 3 into chamber 24. Valve 50 allows venting of chamber 24 to waste reservoir 33 for disposal. A standard high pressure regulator 53 and a standard low pressure regulator 54, as used in the prior art Model 250 decapsulator, supplies debris purging gas. About 40 psi of nitrogen gas is supplied by line 55 to operate the pneumatic controls (not shown) for the various valves.

To effectively transport etch debris and create a clean cavity, a flow rate of 25 to 30 ml per minute of acid is required. To establish a 30 ml per minute flow rate from the agitator syringe, with a 2 second full cycle time, requires a 0.5 ml agitator syringe. A 0.5 ml agitator volume requires a heat exchanger core with at least 1 ml total volume to keep the agitated volume heated while bringing the next increment of pumped etchant from pump 30 up to temperature in the range of 70°–240° C. depending on the acid used and other process parameters. In addition, the waste side of the etch head assembly preferably has a heated volume of at least 0.5 ml. Since the pump syringe 30 is isolated from the agitator syringe 40 by a valve 31, it need only have the displacement required to fill the system from the syringe to the device package. With the valve 31 isolated, the pump 30 can be drawing in acid from a source bottle 36 or 37 while the agitator syringe 40 is agitating the active volume of acid.

The etch process proceeds as follows.

1. The syringe pump 30 draws in a full volume from the acid source bottle. The agitator syringe 40 is at zero volume and all lines are clear of acid.
2. The syringe pump 30 fills the lines 32 from valve 31 to the heat exchange block and in the etch head up to the device package surface abutting the etch head.
3. After the acid heats to etching temperature in the heat exchange core passageway 17, the syringe pump 30 moves an additional 0.5 ml (the volume of the agitator syringe) into the system.
4. With valve 31 closed the agitator syringe 40 is activated drawing in its full volume from the heat exchanger block in one second and returning the "agitating" volume in the next second. These cycles continue typically for 5–20 cycles until the acid reaches its carry capacity. "Carry capacity" as used herein means the amount of debris that the acid can contain and still allow flow of the resultant slurry, without plugging of the various flow passages.
5. The agitator syringe 40 is returned to the zero volume position and the syringe pump 30 moves another 0.5 ml of acid into the system.
6. Steps 4 and 5 are repeated as required. Typically about 16 cycles are needed to effect movement of waste acid to the waste bottle 33. If the syringe pump 30 volume is exceeded, it will draw more acid from the source bottle during the agitation portion of the cycle. During the last agitation cycle, the syringe pump 30 draws a rinse volume from the source bottle.
7. After the device is fully etched to form a decapsulated aperture 3a (FIG. 3) in the device package and exposure of the wire bonds, for example, the agitator syringe 40 returns to the zero volume position and the syringe pump 30 moves the rinse volume into the system. At the end of the rinse pumping cycle, both pump valves 31 and 38 are opened and the entire system is cleared of acid with dry nitrogen from the $N_2$ system 52. Valves 39 and 50 may also be opened to allow flushing of the chamber 24 with nitrogen. It is desired that chamber 24 be an inert environment with no oxygen or water present. Some residual acid will be left in the syringes and valve dead volumes. This may require an acid flush cycle when changing from one acid to the other.

Etching small devices may require only one agitation cycle and the time of the cycle needs to be programmable to control the total etch time. The minimum acid used to etch a part is determined by the fill volume, the agitation syringe displacement, and the minimum rinse volume. The maximum acid consumed is simply a function of the carry capacity of the acid and the volume of material to be removed. Etching low etch rate plastics requires more time, not more acid as the agitation cycle time can be increased to insure complete use of the acid.

The increased agitation in the etched cavity will reduce the total etch time required, particularly for large devices. The constant movement of acid into and out of the etched cavity will be more efficient at removing non-reactive materials, e.g. carbon or glass particles in the plastic encapsulant, from the etched face exposing more reactive material for etching. Even if this does not reduce the etch time for normal devices and plastics, the total cycle time will be reduced because of the reduced fill time and the elimination of any device heat up time. As the acid is heated both in the heat exchanger and the waste tube, the agitation will efficiently transfer heat to the device. This will allow for faster heating than some current etchers where the heat up time currently is determined by the thermal conductivity of the gasket. Using the acid as the heat transfer medium will require that the first agitation cycle be increased in time as there will be little etching until the acid has heated the device up to the etch temperature. In the prior art Model 250, the minimum heat up time is 50 seconds. Twelve seconds of this is required to lower the safety cover and purge and pressurize the chamber. The remainder of the heat up time is required to fill the heat exchanger, heat the acid, and preheat the device being etched. With the syringe system of this invention, the fill time will be one to two seconds, the acid heat time will be about six seconds, and then agitation can be started. This will reduce the total cycle time by thirty seconds down to about 20 seconds.

Figure 5:
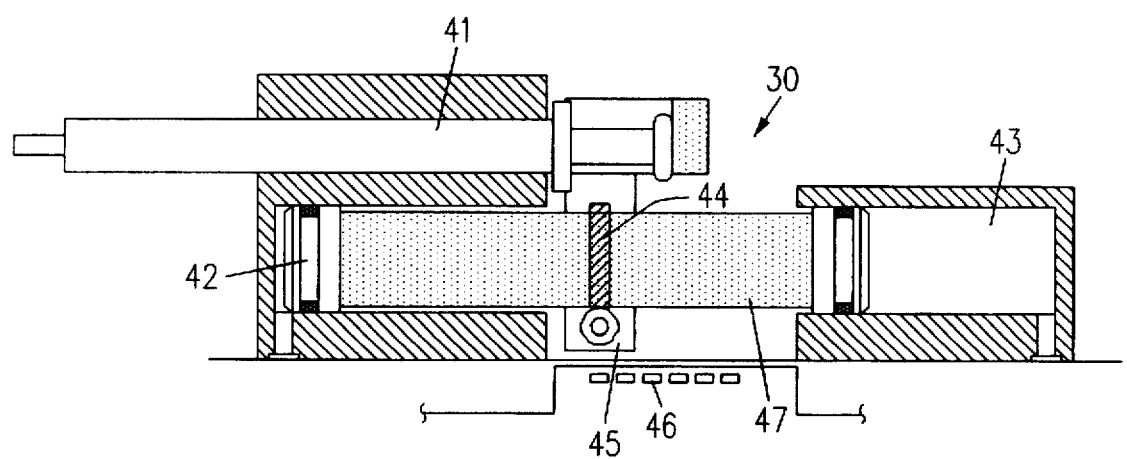
FIG. 5 is a cross sectional view of the agitation syringe with associated metering sensors.

Some of the control functions for the syringe pump 30 and agitator syringe 40 lend themselves well to local control. The agitator syringe with its two position sensor needs to run at its own rate as determined by the exhaust relief valves on a pneumatic control. The pump syringe stroke in pump 30 is controlled to draw and discharge fixed amounts of acid as determined by a minimum of six position Hall-sensors 46 as seen in FIG. 5. Two spaced Hall-sensors may be used to determine the fixed stroke of the agitation syringe 40, particularly that the agitation syringe is operating at its proper stoke. Fiber-optic sensors (not shown) may also be utilized. The activity of the pump syringe 30 preferably is synchronized with the operation of the agitator syringe 40. A small local processor, such an a PIC 16C55 processor available from Microchip Technologies of Chandler, Ariz., as is known in the art is used to control the pump and agitator functions. The control electronics are distributed between the multi-controller and the processor in the etcher unit. The multi-controller provides the user interface and the supervisory control of the etcher unit. A temperature control subprocessor (not shown) measures the output of the thermocouple-type resistor, ambient temperature, line voltage, and current into the heaters. It adjusts the current into heaters based on the difference between the desired temperature of the heat exchanger and the actual temperature thereby controlling the heat exchanger temperature. A multi-controller (not shown) is used to send commands to the local processors and the local processor performs the actual pump and temperature control.

Etchant selection, safety equipment for the operator, unit set-up details of a typically used controller modified for use with the dual syringes of the invention, and general mechanical and electrical operations of a typical decapsulator are in the Model 250 operation, installation and service manual, the content of which are incorporated herein by reference.

The pump assembly includes the syringe pump 30, the agitator syringe 40, acid selection valves, and the associated fittings and plumbing. The assembly is mounted on a plate that will separate the acid from the clean side of the etcher unit. Only pneumatic control lines will pass through the plate and no electronics will be mounted on the acid side. All components, other than springs, screws, and syringe plunger shafts, will be made of Teflon®, glass, polypropylene, or PVC or other acid-resistant material. All metal components, where possible, are made of stainless steel.

As shown in FIG. 5 the syringe 41 per se is driven by two separate air cylinders 42 and 43. Nitrogen is fed into the feed cylinder 42 drawing fluid into the syringe 41. The return cylinder 43 is pressurized to force fluid from the syringe. A magnet 44 is placed in a rod clamp 45 to activate Hall-effect position sensors 46. The control pressure to the cylinders is fed from the mounting face eliminating plumbing from the acid side. A piston 47 made of Teflon plastic because of its wear resistance and natural lubricity extends between the cylinders. All other components, other than the syringe, are made of PVC because of its strength and acid resistance. Two syringe pumps and two manifold valve assemblies make up the complete pump assembly. A three valve manifold provides acid and nitrogen selection. All three valves are normally closed and pneumatically activated. All manifold ports are the standard ¼–28 thread. The second manifold contains only normally closed valve and interconnects syringe Luhr fittings (not shown) with the inlet and outlet.

Acid flow is in direct contact with the heat exchanger. The heat exchanger core 27 is a spirally grooved (on the outside) cylinder that is in press-fitted connection in the heat exchanger block 26. The acid flows through the passageway 17 from the inlet fitting to the etch head. Because the acid is in direct contact with the heat exchanger and block, it heats up very fast requiring only a small acid volume in the heat exchanger core. The heat exchanger core and the heat exchanger block both are made of 99.8% alumina ceramic, allowing for both high thermal conductivity and acid resistance. The heat exchanger is removable for cleaning after the etch head has been removed.

Figure 6:
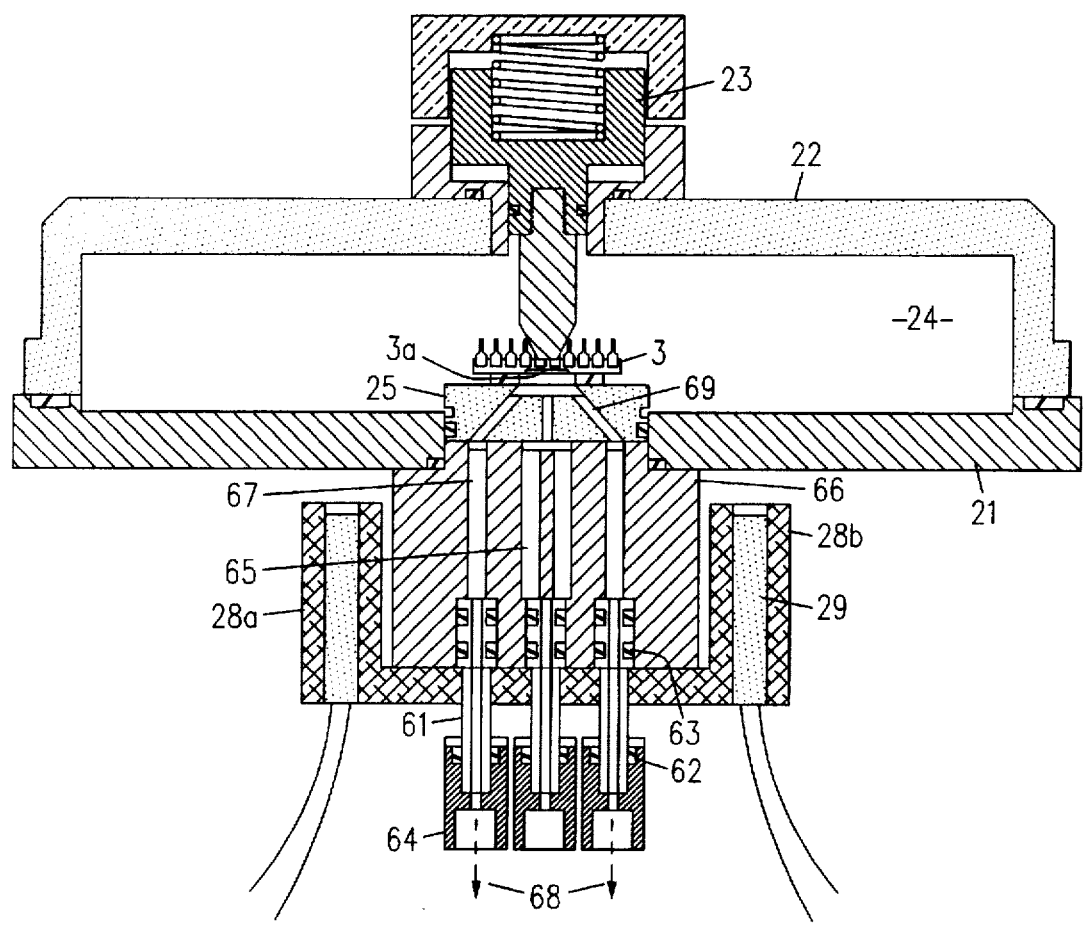
FIG. 6 is a cross-sectional view of a modified form of the etch head assembly including the heater blocks and the heat exchanger block.
Figure 7:
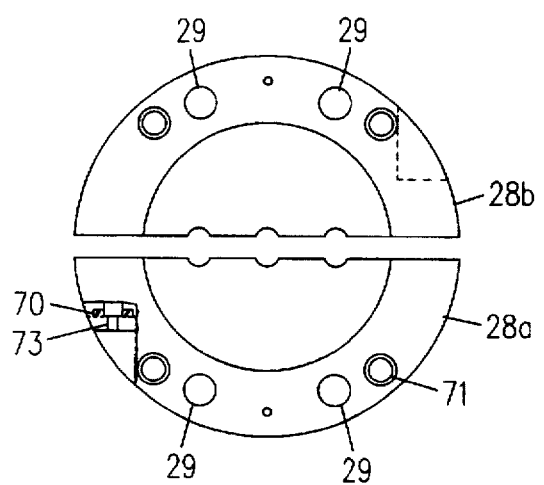
FIG. 7 is a partially cut-away end view of the heater blocks.

As seen in FIG. 6 and FIG. 7 the heat exchanger block 66 is clamped between two heater blocks 28a and 28b in another embodiment of the heater block and heat exchanger block in FIG. 6. The heater blocks 28a and 28b each contain a cartridge heater 29. The heater blocks are made of aluminum. The heater blocks are bolted together and spring loaded by Belleville washers 70 or the like to maintain contact of the heater blocks with the ceramic heat exchanger block, while being allowed to expand when heated. For clarity purposes a gap is shown at this interface between the heat exchanger block and the heater blocks. Bolts 73 secure the heater blocks and holes 71 are provided to bolt the entire assembly to the etch plate. These bolts may be threaded into O-ring sealed nuts (not shown) that pass through the etch plate. The inlet and outlet ports are ceramic tubes 61, sealed by O-rings 63 into the heat exchanger block 66 and secured by the heater blocks 28a and 28b. These tubes allow for some thermal isolation so that standard Teflon transition fittings can be used to attach tube couplings 64 and O-rings 62 and Teflon tubing used in the remainder of the unit. All O-rings are Kelrez® material for its temperature range and acid resistance. In this embodiment the acid is conveyed through a central annulus, a set of four circular holes forming an inlet 65, and waste acid with etching debris conveyed away from the cavity 3a in the chip 3, through slightly modified etch head passages 69 and through outlet circular holes 67 in the heat exchanger 66 to waste (arrows 68).

The above description of the preferred embodiments of this invention is intended to be illustrative and not limiting. Other embodiments of this invention will be obvious to those skilled in the art in view of the above disclosure.

I claim:

1. An apparatus for selectively etching an encapsulant forming a package of resinous material around an electronic device comprising:

a source of etchant solution;

an etching assembly including an etch plate and a movable cover, said etch plate and cover forming an etching chamber;

an etch head supported by said etch plate, wherein an electronic device package is mountable in said chamber on said etch head;

a first pump for pumping a first quantity of etchant solution into said etch head;

a second pump for agitating at least part of the first quantity of etchant solution into and out of an etched cavity formed on an exterior surface of the electronic device package by reaction of the etchant solution with the resinous material; and a waste outlet extending from said etch head to disposal.

2. The apparatus of claim 1 wherein said first pump and said second pump are syringe pumps, the second pump incrementally pumping a smaller volume of etchant solution than the first pump.

3. The apparatus of claim 2 further comprising a supply line extending from said source of etchant solution to said etch head, said first and second pumps each being in separate flow connection to a supply line;

a valve in said flow line between the flow connections of said first and second pumps, wherein when said valve is open, a supply of etchant solution fills the flow line upstream of the first pump flow connection upon operation of the first pump and, when said valve is closed, a first portion of the first quantity of etchant solution in the flow line upstream of said valve is moved back and forth into and out of said second pump and a second portion of the first quantity of etchant solution is moved through said etch head.

4. The apparatus of claim 3 further comprising a heat exchanger block including an etchant solution inlet connected to said flow line, said etch head being in flow connection to said heat exchanger block, and a heat exchanger within said heat exchanger block and including a flow passage in flow connection to said supply line.

5. The apparatus of claim 4 further comprising a heater block concentrically surrounding and in contact with an exterior peripheral portion of said heat exchanger block, said heater block including at least one heater for heating said heater block, such that heat from said heater and said heater block heats said heat exchanger and etchant solution flowing through said heat exchanger to said etch head.

6. The apparatus of claim 5 wherein said heat exchanger block and said heat exchanger are constructed of alumina ceramic material and said heater block is constructed of aluminum material.

7. The apparatus of claim 6 wherein said ceramic material is about 99.8 weight percent of alumina.

8. The apparatus of claim 7 wherein said etchant solution inlet includes a ceramic tube, O-ring sealed in said heat exchanger block.

9. The apparatus of claim 4 wherein said heat exchanger and such flow passage comprises a cylinder having an exterior spiral groove, said cylinder being in press-fitted connection in said heat exchanger block, said groove extending spirally in a direction of parallel to a longitudinal axis of said etchant solution inlet and said heat exchanger block.

10. The apparatus of claim 3 further comprising a heat exchanger block including an etchant solution inlet connected to said flow line, said etch head being in flow connection to said heat exchanger block inlet, and a heater block concentrically surrounding the heat exchanger block.

11. The apparatus of claim 10 wherein said heater block comprises a pair of block halfs in spring-pressed connection against said heat exchanger block.

12. The apparatus of claim 1 wherein said etch head includes a demountable cylindrical plug O-ring sealed in said etch plate, said plug having a passageway extending through said plug in flow connection to said source of etchant solution and wherein the electronic device package is mounted on a surface of said plug facing said etching chamber.

13. The apparatus of claim 12 further comprising an etch disk in a surface of said cylindrical plug and outwardly facing said etching chamber, said etch disk having an orifice for etching away a shaped hole through the exterior surface of the electronic device package.

14. An apparatus for selectively etching an encapsulant forming a package around an electronic device comprising:
   a source of etchant solution;
   an etching assembly including an etch plate and a movable cover, said etch plate and cover forming an etching chamber;
   an etch head supported by said etch plate, wherein an electronic device package is mounted in said chamber on said etch head; and
   wherein said etch head includes a cylindrical plug, O-ring sealed in said etch plate, said plug being demountable from said etch plate in a direction facing said etching chamber, said plug having a passageway extending through said plug in flow connection to said source of etchant solution and wherein the electronic device package is mounted on a surface of said plug facing said etching chamber.

15. The apparatus of claim 14 further comprising an etch disk in a surface of said cylindrical plug and outwardly facing said etching chamber, said etch disk having an orifice for etching away a shaped hole in the exterior surface of the electronic device package.

16. The apparatus of claim 14 further comprising a first syringe pump in flow connection between said source of etchant solution and said etch head for moving a volume of etchant solution into and out of said etch head and a second syringe pump for agitating said volume cyclically against an exterior of an electronic device package positioned on said etch head.

17. The apparatus of claim 14 wherein said cylindrical plug includes a cylindrical groove extending in a plane above a plane of said etch plate for finger grasping and removal of said cylindrical plug from said etch plate.

18. A method of decapsulating a plastic package of resinous material surrounding an encapsulated electronic device comprising:
   providing a source of etchant solution and an etching assembly including an etch plate and a movable cover, and an etch head in flow connection to the source of etchant solution;
   positioning an electronic device package of resinous material on the etch head;
   pumping a volume of etchant solution from the source of etchant solution to the etch head;
   oscillating at least a portion of the volume of etchant out of and back into the etch head; and thereby digesting the resinous material to form a hole in said package.

19. The method of claim 18 further comprising the steps of performing a series of oscillating cycles and then repeating the pumping step.

20. The method of claim 19 wherein said series of oscillating cycles in number are from 5 to 20 cycles prior to the repeating the pumping step.

21. The method of claim 18 further comprising pumping a sufficient volume of etchant fluid such that a portion of the volume exits to waste.

22. The method of claim 21 wherein from about ten to about twenty pumping steps are performed prior to the waste reaching a waste reservoir.

23. An apparatus for selectively etching an encapsulant forming a package of resinous material around an electronic device comprising:
   a source of etchant solution;
   an etching assembly including an etch plate and a movable cover, said etch plate and cover forming an etching chamber;
   an etch head supported by said etch plate, wherein an electronic device package is mountable in said chamber with respect to said etch head;
   a first pump for pumping a first quantity of etchant solution into said etch head; and against an exterior surface of the package;
   a second pump for agitating at least part of the first quantity of etchant solution into and out of an etched cavity formed on the exterior surface of the electronic device package by reaction of the etchant solution with the resinous material; and
   a waste outlet extending from said etch head to disposal.

24. The apparatus of claim 1 wherein said first pump and said second pump are syringe pumps, the second pump incrementally pumping a smaller volume of etchant solution than the first pump.

* * * * *